United States Patent
He

(10) Patent No.: US 11,145,385 B2
(45) Date of Patent: Oct. 12, 2021

(54) SYSTEM-LEVEL TEST METHOD FOR FLASH MEMORY

(71) Applicant: AMLOGIC (SHANGHAI) CO., LTD., Shanghai (CN)

(72) Inventor: Yuegui He, Shanghai (CN)

(*) Notice: Subject to any disclaimer, the term of this patent is extended or adjusted under 35 U.S.C. 154(b) by 0 days.

(21) Appl. No.: 16/646,353

(22) PCT Filed: Oct. 31, 2018

(86) PCT No.: PCT/CN2018/113151
§ 371 (c)(1),
(2) Date: Mar. 11, 2020

(87) PCT Pub. No.: WO2019/227844
PCT Pub. Date: Dec. 5, 2019

(65) Prior Publication Data
US 2020/0273533 A1    Aug. 27, 2020

(30) Foreign Application Priority Data

Jun. 1, 2018    (CN) .......................... 201810559206.6

(51) Int. Cl.
G11C 29/00    (2006.01)
G11C 29/56    (2006.01)
G11C 29/38    (2006.01)

(52) U.S. Cl.
CPC .............. *G11C 29/56* (2013.01); *G11C 29/38* (2013.01)

(58) Field of Classification Search
None
See application file for complete search history.

(56) References Cited

FOREIGN PATENT DOCUMENTS

| CN | 101369463 | 2/2009 |
|---|---|---|
| CN | 101710237 | 5/2010 |
| CN | 107391300 | 11/2017 |

*Primary Examiner* — Guerrier Merant
(74) *Attorney, Agent, or Firm* — Clement Cheng

(57) ABSTRACT

The present invention relates to the technical field of integrated chips, and more particularly, to a system-level test method for a flash memory. The method comprises: step S1, providing a test flag file, and storing a test number parameter in the test flag file; step S2, determining whether a value of the test number parameter reaches a pre-set value; if not, turning to step S3; if yes, ending and counting a verification result; step S3, performing one partition mirror data check on all partitions of the flash memory, and performing one file data check on a current system file of the flash memory; and step S4, restarting a test device, subtracting one from the value of the test number parameter, and returning to step S2.

10 Claims, 1 Drawing Sheet

SYSTEM-LEVEL TEST METHOD FOR FLASH MEMORY

BACKGROUND OF THE INVENTION

1. Field of the Invention

The invention relates to the field of integrated circuits, and more particularly, to a system-level test method for a flash memory.

2. Description of the Related Art

The NAND flash memory is a storage device having a better performance than a hard disk drive, and it is in particular the case when it is used in applications having a low volume of not exceeding 4 GB. As people tend to pursue products with lower power consumption, lighter weight and better performance, the NAND proves to be attractive. The NAND flash memory is a non-volatile storage technology, that is, it may save data even power outage occurs. Its development goal is to reduce storage cost per bit and increase storage capacity.

Other than a chip level and a bad block table comparison, there are a few methods than can be used for performing a test on some NAND flash memories commercially available in the market. When the NAND flash memory is provided to project designers and original equipment manufacturers as a product, it has some difficulty in performing the test on the NAND flash memory on a large scale by means of the chip level and the bad block table comparison, since the existing NAND flash memory lacks a system-level test method, and each manufacturer uses its own platform for the NAND flash memory. Thus, it is desired to have a system-level test method.

Since a lack of the system-level test method, it is impossible to perform screening and testing on the NAND flash memory on a large scale. It should be noted that it is really hard to identify defect rate of the NAND flash memory and its hidden problems by means of a chip-level and a driver-level method.

SUMMARY OF THE INVENTION

Aiming at the above-mentioned problems in the prior art, the present invention provides a system-level test method for a flash memory, applied to a flash memory; wherein a test device is used, and the test device comprises a partition mirror storage system and a file storage system;

an original mirror is pre-stored in the partition mirror storage system;

verification files having a plurality of pre-set characters pre-stored in the file storage system;

the method comprises:

step S1, providing a test flag file, and storing a test number parameter in the test flag file;

step S2, determining whether a value of the test number parameter reaches a pre-set value;

if not, turning to step S3; if yes, ending and counting a verification result;

step S3, performing one partition mirror data check on all partitions of the flash memory, and performing one file data check on a current system file of the flash memory; and step S4, restarting the test device, subtracting one from the value of the test number parameter, and returning to step S2;

wherein in step S3, the partition mirror data check comprises comparing current mirrors of all of the partitions in the flash memory to the original mirror;

in step S3, the file data check comprises comparing a current system file of the flash memory to the verification file.

In the above-mentioned system-level test method, wherein the pre-stored original mirror is obtained by pre-reading each of the partitions of the flash memory.

In the above-mentioned system-level test method, wherein a method for obtaining the current mirror comprises:

after writing the original mirror to each of the partitions of the flash memory, reading and copying each of the partitions to obtain the current mirrors.

In the above-mentioned system-level test method, wherein the partition mirror storage system comprises a first partition mirror storage sub-system and a second partition mirror storage sub-system;

the original mirror is stored in the first partition mirror storage sub-system; and the current mirrors are stored in the second partition mirror storage sub-system.

In the above-mentioned system-level test method, wherein the file storage system comprises a first file sub-system and a second file sub-system;

the verification files are stored in the first file sub-system; and the current system file is stored in the second file sub-system.

In the above-mentioned system-level test method, wherein a method for obtaining the verification file comprises:

creating a plurality of source system files having the plurality of pre-set characters, and copying each of the plurality of source system files, so as to form each of the verification files.

In the above-mentioned system-level test method, wherein the number of the plurality of pre-set characters comprise: a storage page size*N, a storage page size*N+Z, and a storage page size/N+Z;

wherein N is a positive integer and Z is a random positive integer smaller than the storage page size.

In the above-mentioned system-level test method, wherein a verification result report is generated after getting the verification result.

In the above-mentioned system-level test method, wherein the verification result report is in a log format.

In the above-mentioned system-level test method, wherein the pre-set value is 0.

By adopting the above-mentioned technical solutions, the present invention has the following beneficial effects: a system-level test method for a flash memory is capable of completing the partition mirror data check and the file data check simultaneously in the test process, a system-level test result is easy to form, and the test efficiency is high.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
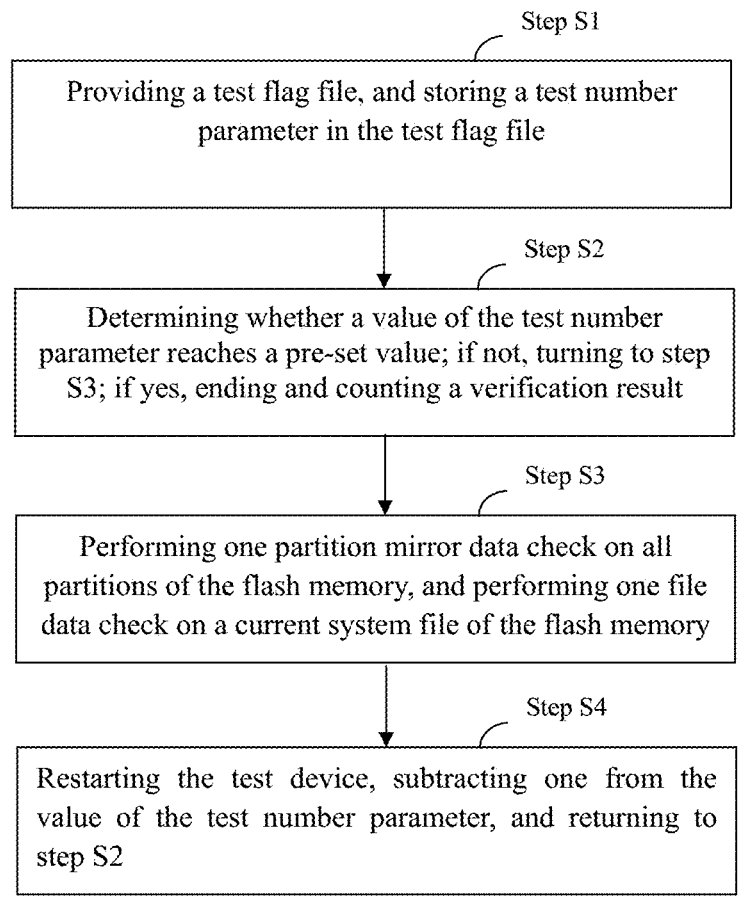
FIG. 1 is a flow chart showing steps of a system-level test method for a flash memory according to an embodiment of the present invention.
Figure 2:
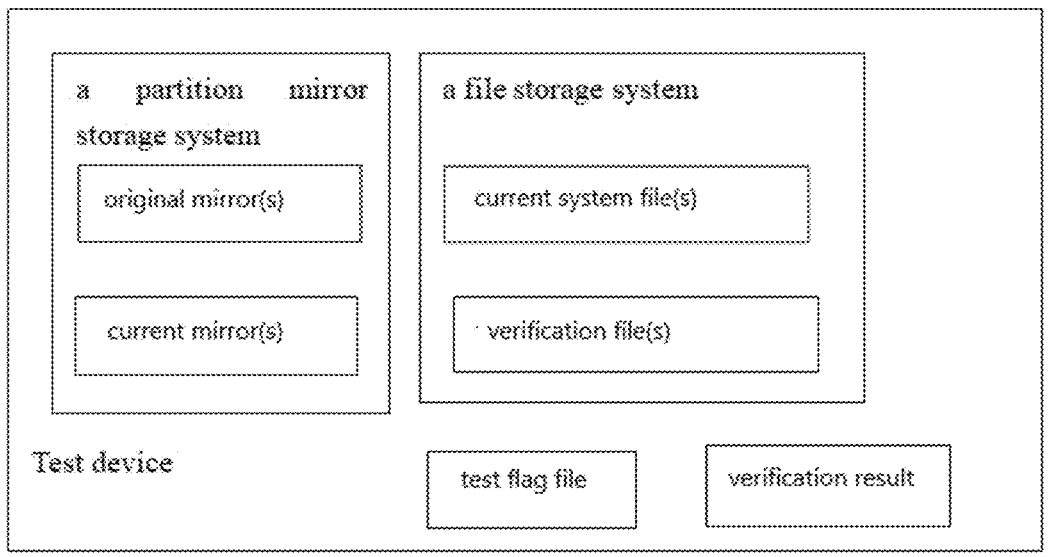
FIG. 2 is a block diagram of a test device.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

In a preferred embodiment, as shown in FIG. 1, there is provided a system-level test method for a flash memory, applied to a flash memory, wherein a test device is used, and the test device comprises a partition mirror storage system and a file storage system;

an original mirror is pre-stored in the partition mirror storage system;

verification files having a plurality of pre-set characters pre-stored in the file storage system;

the method comprises:

step S1, providing a test flag file, and storing a test number parameter in the test flag file;

step S2, determining whether a value of the test number parameter reaches a pre-set value;

if not, turning to step S3; if yes, ending and counting a verification result;

step S3, performing one partition mirror data check on all partitions of the flash memory, and performing one file data check on a current system file of the flash memory; and step S4, restarting the test device, subtracting one from the value of the test number parameter, and returning to step S2;

wherein in step S3, the partition mirror data check comprises comparing current mirrors of all of the partitions in the flash memory to the original mirror;

in step S3, the file data check comprises comparing a current system file of the flash memory to the verification file.

In the above-mentioned technical solution, the value of the test number parameter reflects the number of the test to be completed, for example if it is N, then the test is continued until the value of the test number parameter reaches the pre-set value; the pre-set value may be set to 0; and the flash memory in the present invention may be a NAND flash memory.

In the above-mentioned technical solution, the test device needs to be restarted each time the partition mirror data check and the file data check is performed. At this point, the test device may restart the flash memory, however, the restart process will not impact the continuity of the value of the test number parameter, therefore ensuring that the test number parameter reflects a total number of the test.

In this present invention, the partition mirror data check is combined with the file data check, such that the partition mirror data check and the file data check can be completed simultaneously. Such a method is a comprehensive and complete system-level test method.

In a preferred embodiment, the pre-stored original mirror is obtained by pre-reading each of the partitions of the flash memory.

In the above-mentioned technical solution, when it comes to comparison between the original mirror and the current mirror, it may refer to comparing specific parameters which reflect whether the original mirror and the current mirror have been changed; if the specific parameters are the same, then it may be considered that the original mirror is consistent with the current mirror. Therefore, the comparison of the entire data of the original mirrors and the current mirrors is avoided, making the process quicker and more efficient.

In the above-mentioned embodiment, preferably, a method for obtaining the current mirror comprises:

after writing the original mirror to each of the partitions of the flash memory, reading and copying each of the partitions to obtain the current mirrors.

In a preferred embodiment, wherein the partition mirror storage system comprises a first partition mirror storage sub-system and a second partition mirror storage sub-system;

the original mirror is stored in the first partition mirror storage sub-system; and the current mirrors are stored in the second partition mirror storage sub-system.

In the above-mentioned technical solution, first partition mirror storage sub-system and the second partition mirror storage sub-system may be independent storage systems or different storage areas in a storage system.

In a preferred embodiment, wherein the file storage system comprises a first file sub-system and a second file sub-system;

verification files are stored in the first file sub-system; and the current system file is stored in the second file sub-system.

In the above-mentioned technical solution, the first file sub-system and the second file sub-system may be independent storage systems or different storage areas in a storage system.

In a preferred embodiment, wherein a method for obtaining the verification files comprises:

creating a plurality of source system files having the plurality of pre-set characters, and copying each of the plurality of source system files, so as to form each of the verification files.

In a preferred embodiment, wherein the number of the plurality of pre-set characters comprise: a storage page size*N, a storage page size*N+Z, and a storage page size/N+Z;

wherein N is a positive integer and Z is a random positive integer smaller than the storage page size.

The above-mentioned technical solution ensures a various number of characters exist in the present invention, thus ensures the diversity of the character number in the verification files.

In a preferred embodiment, a verification result report is generated after getting the verification result.

In the above-mentioned embodiment, preferably, the verification result report is in a log format or other alternative formats.

In a preferred embodiment, the pre-set value may be 0.

In conclusion, the present invention provides a system-level test method for a flash memory. The method comprises: step S1, providing a test flag file, and storing a test number parameter in the test flag file; step S2, determining whether a value of the test number parameter reaches a pre-set value; if not, turning to step S3; if yes, ending and counting a verification result; step S3, performing one partition mirror data check on all partitions of the flash memory, and performing one file data check on a current system file of the flash memory; and step S4, restarting a test device, subtracting one from the value of the test number parameter, and returning to step S2; the partition mirror data check and the file data check can be completed simultaneously in the test process, a system-level test result is easy to form, and the test efficiency is high.

With reference to detailed description and the accompanying drawings, typical embodiments of a particular structure of the detailed description are given; while other transformation of the particular structure may be done without departing from the spirit of the present invention. Although the existing preferred embodiments are put forward in the present invention, the present invention is not limited thereto.

Variations and modifications of the present invention will be more apparent to those skilled in the art with reference to the above-mentioned detailed description. Therefore, it is intended to cover all variations and modifications within the true purpose and scope of the present invention as defined by the appended claims. Any and all the equivalents are construed to fall within the purpose and scope of the present invention.

What is claimed is:

1. A system-level test method for a flash memory, applied to a flash memory, wherein a test device is used, and the test device comprises a partition mirror storage system and a file storage system;
   an original mirror is pre-stored in the partition storage system;
   verification files having a plurality of pre-set characters pre-stored in the file storage system;
   the method comprises:
   step S1, providing a test flag file, and storing a test number parameter in the test flag file;
   step S2, determining whether a value of the test number parameter reaches a pre-set value; if not, turning to step S3; if yes, ending and counting a verification result;
   step S3, performing one partition mirror data check on all partitions of the flash memory, and performing one file data check on a current system file of the flash memory; and
   step S4, restarting the test device, subtracting one from the value of the test number parameter, and returning to step S2;
   wherein in step S3, the partition mirror data check comprises: comparing current mirrors of all of the partitions in the flash memory to the original mirror;
   in step S3, the file data check comprises: comparing a current system file of the flash memory to the verification file.

2. The system-level test method for a flash memory of claim 1, wherein the pre-stored original mirror is obtained by pre-reading each of the partitions of the flash memory.

3. The system-level test method for a flash memory of claim 2, wherein a method for obtaining the current mirror comprises:
   after writing the original mirror to each of the partitions of the flash memory, reading and copying each of the partitions to obtain the current mirrors.

4. The system-level test method for a flash memory of claim 1, wherein the partition mirror storage system comprises a first partition mirror storage sub-system and a second partition mirror storage sub-system;
   the original mirror is stored in the first partition mirror storage sub-system; and
   the current mirrors are stored in the second partition mirror storage sub-system.

5. The system-level test method for a flash memory of claim 1, wherein the file storage system comprises a first file sub-system and a second file sub-system;
   the verification files are stored in the first file sub-system; and
   the current system file is stored in the second file sub-system.

6. The system-level test method for a flash memory of claim 1, wherein a method for obtaining the verification files comprises:
   creating a plurality of source system files having the plurality of pre-set characters, and copying each of the plurality of source system files, so as to form each of the verification files.

7. The system-level test method for a flash memory of claim 1, wherein the number of the plurality of pre-set characters comprise: a storage page size*N, a storage page size*N+Z, and a storage page size/N+Z;
   wherein N is a positive integer and Z is a random positive integer smaller than the storage page size.

8. The system-level test method for a flash memory of claim 1, wherein a verification result report is generated after getting the verification result.

9. The system-level test method for a flash memory of claim 8, wherein the verification result report is in a log format.

10. The system-level test method for a flash memory of claim 1, wherein the pre-set value is 0.

* * * * *